(12) United States Patent
Pietri et al.

(10) Patent No.: US 11,128,306 B1
(45) Date of Patent: Sep. 21, 2021

(54) CLOCK GENERATION

(71) Applicant: NXP USA, INC., Austin, TX (US)

(72) Inventors: Stefano Pietri, Austin, TX (US); Juan Camilo Monsalve, Campinas (BR); Ricardo Pureza Coimbra, Campinas (BR); James Robert Feddeler, Lake Village, IN (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 16/929,566

(22) Filed: Jul. 15, 2020

(51) Int. Cl.
*H03D 3/24* (2006.01)
*H03L 7/099* (2006.01)
*G06F 1/08* (2006.01)

(52) U.S. Cl.
CPC .............. *H03L 7/0992* (2013.01); *G06F 1/08* (2013.01); *H03L 7/0995* (2013.01)

(58) Field of Classification Search
CPC ....... H03L 7/0992; H03L 7/0995; G06F 1/08; H03B 5/36
USPC .......................... 375/376, 327, 373, 294, 377
See application file for complete search history.

(56) References Cited

U.S. PATENT DOCUMENTS

| 9,112,449 B2 | 8/2015 | Hsiao | |
| 10,050,585 B2 | 8/2018 | Kumar et al. | |
| 2012/0126907 A1* | 5/2012 | Nakamoto | H03B 5/36 331/155 |

* cited by examiner

*Primary Examiner* — Phuong Phu
(74) *Attorney, Agent, or Firm* — David G. Dolezal; Joanna G. Geld

(57) ABSTRACT

A clock generation circuit includes a switched capacitor circuit for providing a discrete amount of charge to a resonator for sustaining energization of the resonator at specific portions of the clock cycle.

23 Claims, 8 Drawing Sheets

CLOCK GENERATION

BACKGROUND OF THE INVENTION

Field of the Invention

This invention relates in general to generating a clocking signal.

Description of the Related Art

A clock generation system can be used to produce a clock signal for an electronic system to use for the timing of its operations. Some clock generation systems utilize a resonator such as a crystal resonator for providing a timing signal as a reference for a clock signal.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

In some embodiments, a clock generation circuit includes a switched capacitor circuit for providing a discrete amount of charge to a resonator such as a crystal resonator for sustaining energization of the resonator at specific portions of the clock cycle. In some embodiments, providing a system that provides a discrete amount of sustaining charge during a portion of a clock cycle reduces the power consumption of the circuit and provides consistent charge deliverance to the resonator for energization regardless of system voltage.

Figure 1:
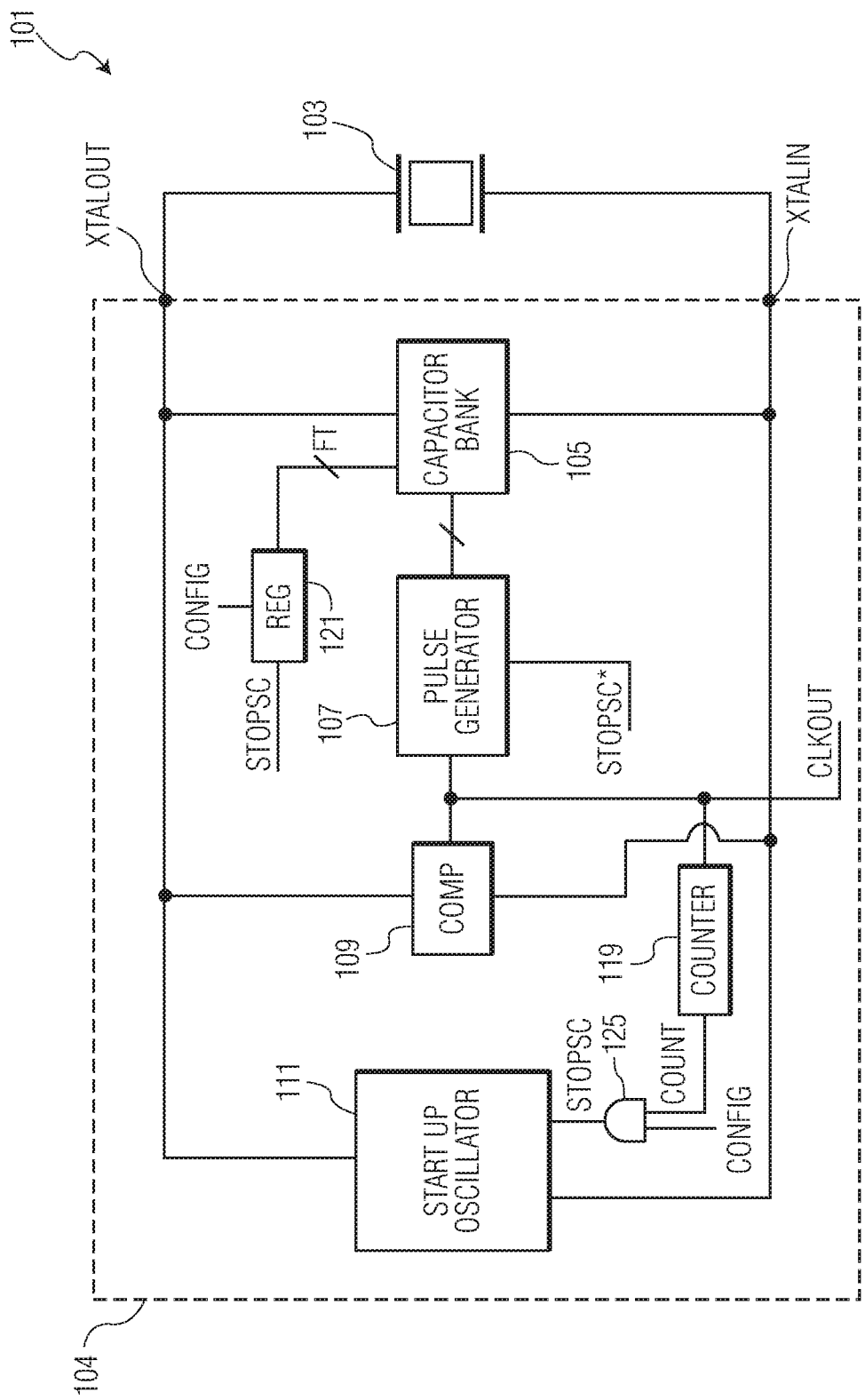
FIG. 1 is a circuit diagram of a clock generation system according to one embodiment of the present invention.

FIG. 1 is a circuit diagram of a clock generation system 101 according to one embodiment. Clock generation system 101 produces a clocking signal (CLKOUT) for an electronic system (not shown) such as e.g. a computer system, a smart phone, an appliance control system, an automobile control system etc. System 101 includes a crystal resonator 103 for generating sinusoidal signals at resonance frequency at terminals XTALOUT and XTALIN. A crystal resonator is an electronic resonator that typically uses the mechanical resonance of a vibrating crystal of piezoelectric material to create an electrical signal with a precise frequency. In one embodiment, the piezoelectric material is a quartz crystal, but other piezoelectric materials, including polycrystalline ceramics, can be used in other embodiments. Other types of resonators that can be used in other embodiments such as a MEMS resonator, a cavity resonator, a dielectric resonator, a transmission line resonator or an electromagnetic resonator.

System 101 includes a clock generation circuit 102 that is connected to terminals XTALOUT and XTALIN. In the embodiment shown, clock generation circuit 102 is implemented on an integrated circuit 104 that is separate from crystal resonator 103. However, in other embodiments, system 101 may be implemented on one integrated circuit or multiple integrated circuits. In one embodiment, terminals XTALOUT and XTALIN are each bond pads on integrated circuit 104. Clock generation circuit 102 uses a sinusoidal timing signal from crystal resonator 103 to generate the clock signal CLKOUT by comparator circuit 109 that is at or nearly at the resonance frequency of crystal resonator 103. In one embodiment, the CLKOUT signal is a square wave pulse signal, but may be of other clock signal types in other embodiments.

In the embodiment shown, circuit 102 includes a start-up oscillator circuit 111 for providing an initial energization charge to crystal resonator 103 during a powering up of system 101. Circuit 102 includes a comparator circuit 109 for generating the CLKOUT signal. Circuit 102 includes a pulse generator 107 for generating pulses for controlling switches in capacitor bank 105.

Capacitor bank 105 includes capacitors for tuning the resonance frequency of crystal resonator 103 to a desired frequency of CLKOUT. In the embodiment shown, some of the capacitors in capacitor bank 105 can also be used in conjunction with pulse generator 107 to provide a finite sustaining charge during portions of the clock cycle to crystal resonator 103 during a steady state operation to keep the crystal resonator 103 providing a timing signal at a desired amplitude.

In the embodiment shown, circuit 102 is capable of operating in two user selected configurations, which is set by the state of the CONFIG signal. In the first configuration where the CONFIG signal is at a high state, start-up oscillator circuit 111 provides energization charge to crystal resonator 103 such that a sufficient amplitude is produced on the XTALOUT and XTALIN signals for comparator circuit 109 to produce a square wave CLKOUT signal for a sufficient number of cycles as determined by counter 119. Once counter 119 determines that a sufficient number of clock cycles (e.g. 8) has been produced, counter 119 asserts a COUNT signal that is ANDed by AND gate 125 with the CONFIG signal to produce the STOPSC signal that stops oscillator circuit 111 from providing charge and signals register circuit 121 to provide signals to capacitor bank 105 so that capacitor bank 105 can be used to provide discrete amounts of charge to crystal resonator 103 as controlled by pulses from pulse generator 107. Pulse generator 107 is enabled by the STOPSC* which is produced by inverting the STOPSC signal (by an inverter that is not shown in FIG. 1).

In a second configuration (as determined by the CONFIG signal being in a low voltage state), start-up oscillator circuit 111 operates continuously, even in a steady state. The COUNT signal is negated by AND gate 125. Pulse generator 107 is not enabled and the capacitor bank 105 is not utilized to provide discrete amounts of charge to crystal resonator 103 during steady state operation. In this second configuration, the register circuit 121 provides the tuning signals (FT) to tune the frequency of the CLKOUT signal to the desired frequency. In one embodiment, register circuit 121 is programed with a value of the desired frequency and selectively couples capacitors of capacitor banks to XTALIN and XTALOUT to tune the resonant frequency of the oscillator and therefore the frequency of the CLKOUT signal.

Figure 2:
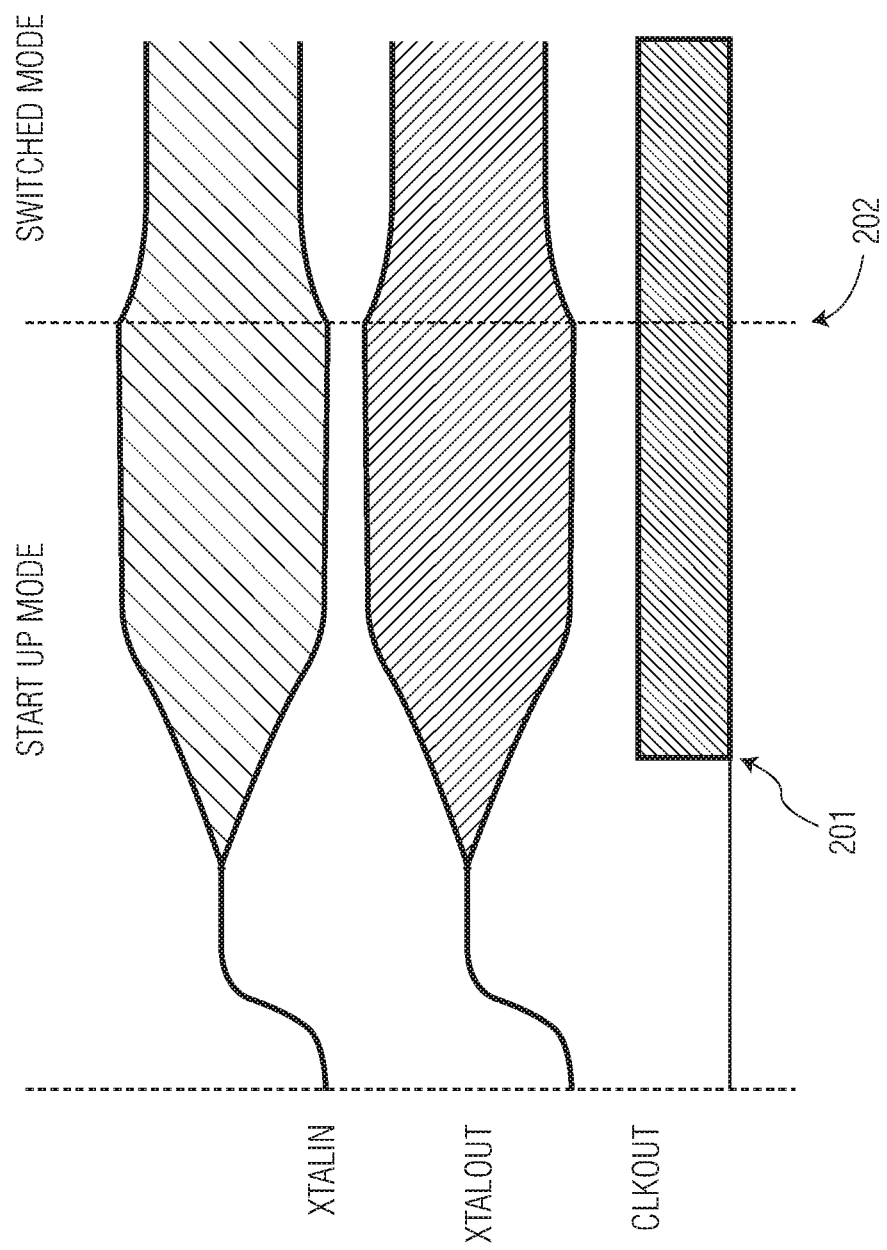
FIG. 2 is a timing diagram showing the operation of clock generation system according to one embodiment of the present invention.

FIG. 2 is a timing diagram of system 101 in the first configuration during start-up of system 101. The timing diagram of FIG. 2 shows the envelopes of the XTALIN, XTALOUT, and CLKOUT signals. During start up, as the system voltages rise, the charge provided by start-up oscillator circuit 111 causes the amplitude of the envelope of the XTALIN and XTALOUT signals to increase to a point 201 where comparator circuit 109 produces the square wave CLKOUT signal. After a specific number of pulses of the CLKOUT signal are detected by counter 119, the STOPSC signal is generated at time 202 to disable startup oscillator circuit 111 and enable pulse generator 107 to provide pulses for at least some of the capacitors of capacitor bank 105 to provide discrete amounts of sustaining charge to crystal resonator 103 during the switched mode.

Figure 3:
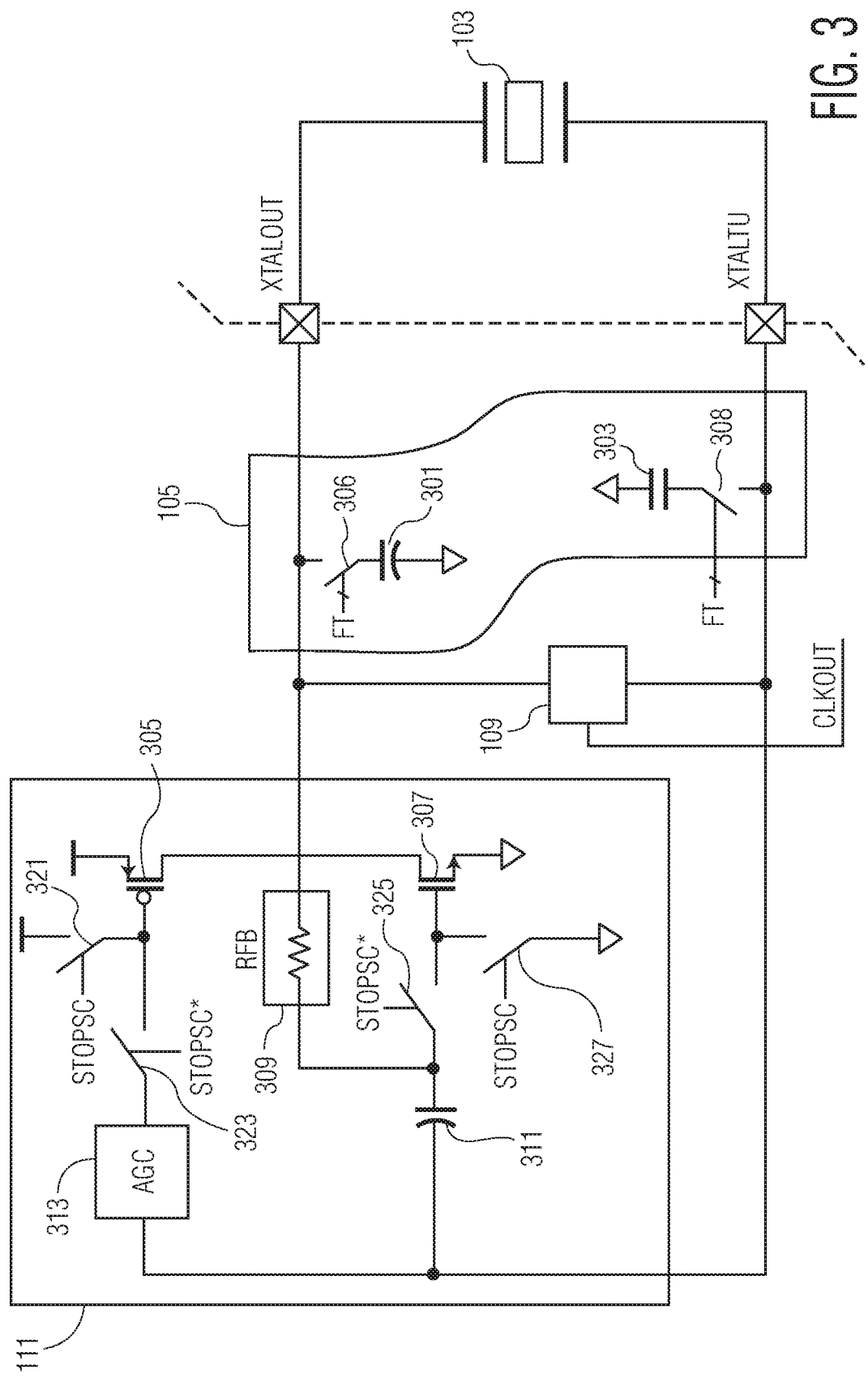
FIG. 3 is a circuit diagram of a clock generation system including additional details of a start-up oscillator according to one embodiment of the present invention.

FIG. 3 is a circuit diagram of clock generation system 101 showing more details of start-up oscillator circuit 111 according to one embodiment. Start-up oscillator includes a gain stage comprising a PFET transistor 305 and an NFET 307. Circuit 111 also includes a resistive circuit 309 to set the gate DC voltage of NFET 307 and a capacitor 311 to provide AC coupling between gate of NFET 307 and node XTALIN. Circuit 313 also includes an automatic gain control circuit 313 for controlling the output amplitude of the start-up circuit 111 output. During operation, circuit 111 operates as a transconductance amplifier to amplify XTALIN and generate XTALOUT. These operations act to increase the amplitude of the signal at XTALOUT and XTALIN during start up. In some embodiments, since current is flowing through the transconductance amplifier for entire portions of the clock cycle, generation of a clock signal may be less energy efficient.

During a start-up mode, capacitors of capacitor sets 301 and 303 of capacitor bank 105 are disconnected from the XTALOUT and XTALIN terminals by open switch sets 306 and 308, respectfully, in that a precise frequency is not needed in some embodiments during startup mode. However, in configurations where startup oscillator runs all the time, those switch sets would be closed after the COUNT signal indicates a certain number of clock signals have been produced.

Start-up oscillator circuit 111 includes switches 321, 323, 325, and 327 to enable and disable start-up oscillator circuit 111. Switches 323 and 325 are closed when the STOPSC* is asserted and switches 321 and 327 are closed when the STOPSC signal is asserted. the STOPSC* signal is an inverted signal of the STOPSC signal and is provided by an inverter (not shown). In one embodiment, the asserted state of the signals described herein is a high voltage level (asserted high) while in other instances, the asserted level is a low voltage level (asserted low). In some embodiments, the switches are implemented with NFETS, but may be implemented with other types of switches in other embodiments such as pass gates or PFETS. In other embodiments, other types of start up oscillators may be used.

Figure 4:
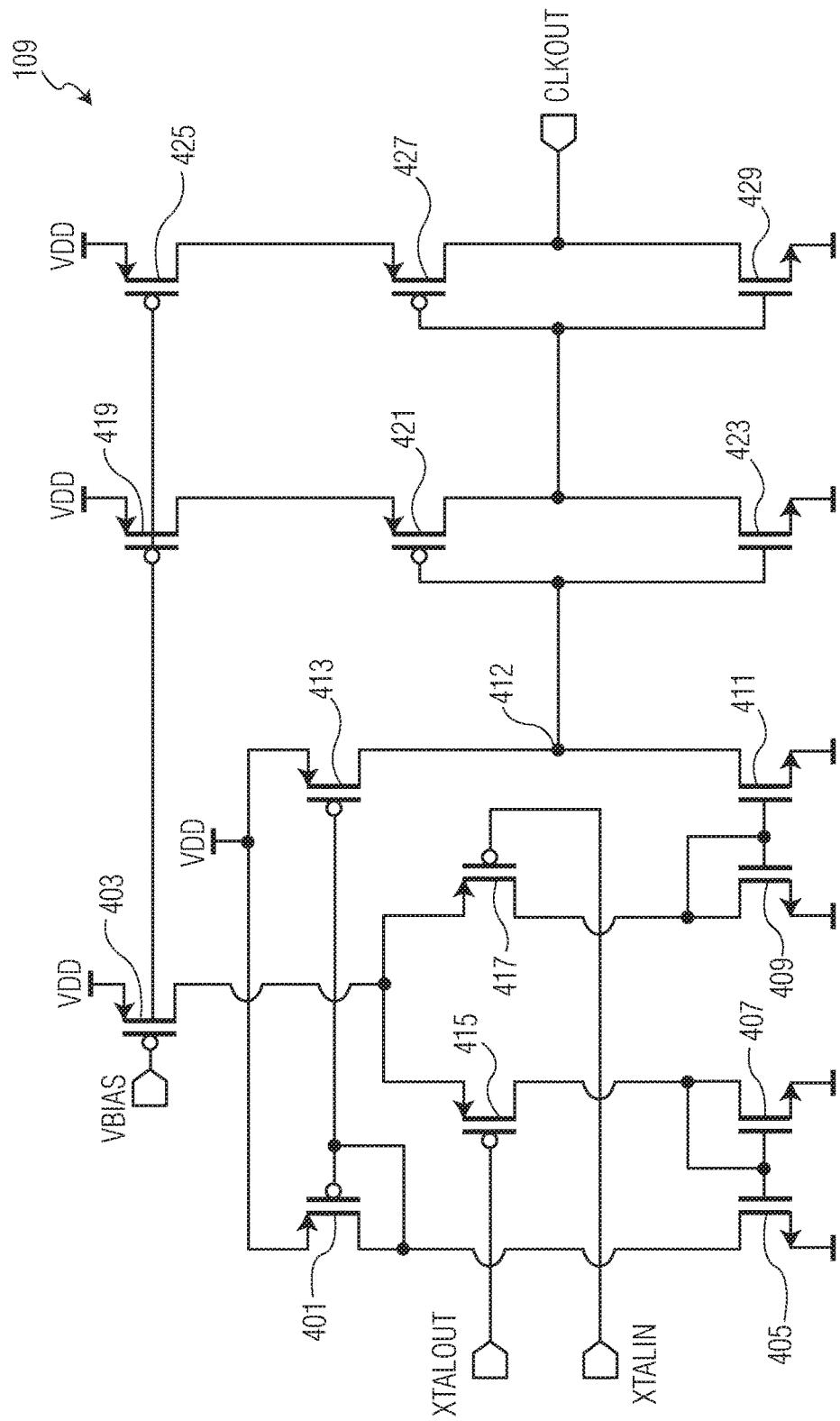
FIG. 4 is a circuit diagram of a comparator circuit according to one embodiment of the present invention.

FIG. 4 is a block diagram of comparator circuit 109 that uses the signals from terminals XTALOUT and XTALIN to provide the clock signal. Comparator circuit 109 includes current bias PFETs 403, 419, and 425, PFETs 401 and 413, input PFETS 415 and 417, and NFETS 405, 407, 409, and 411. Circuit 109 also includes two inverters where one inverter includes transistors 421 and 423 and the other includes transistors 427 and 429. The second inverter provides the CLKOUT signal. The signal response of comparator circuit 109 is dependent upon an amount of current provided by current bias PFETs 403, 419, and 423, which is controlled by the reference VBIAS voltage. If XTALOUT is at a higher voltage than XTALIN, then node 412 (and CLKOUT) will be at a low voltage. If XTALOUT is at a lower voltage than XTALIN, then node 412 (and CLKOUT) will be at a high voltage. Other embodiments may utilize other types of comparators or other types of circuits. For example, in some embodiments the CLKOUT signal would be produced from the signal on the XTALOUT terminal.

Figure 5:
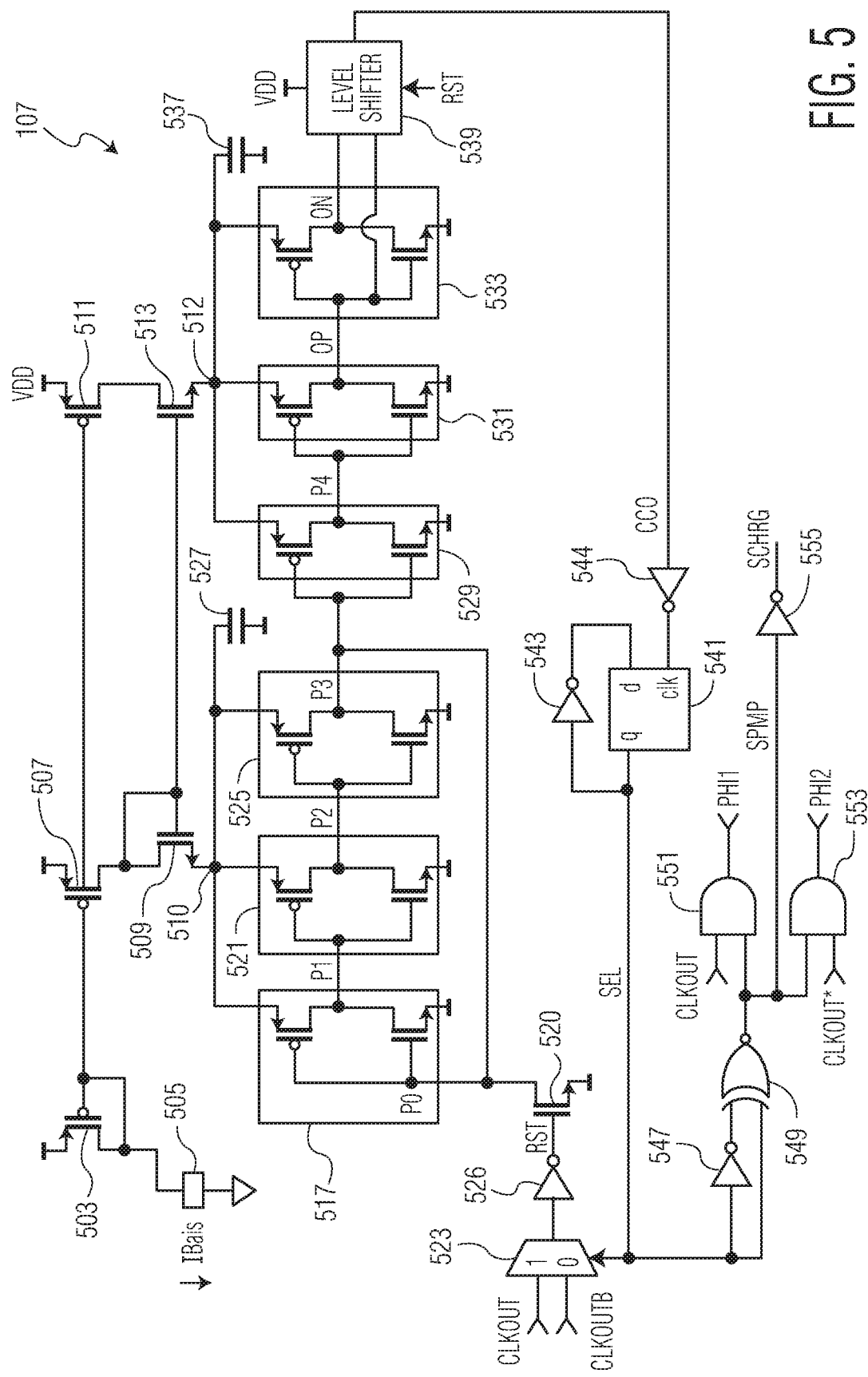
FIG. 5 is a circuit diagram of a pulse generator circuit according to one embodiment of the present invention.

FIG. 5 is a circuit diagram of pulse generator 107. Pulse generator 107 receives the CLKOUT signal and produces pulse signals PHI1, PHI2, SPMP, and SCHRG for controlling capacitors of capacitor bank 105 to transfer discrete charge amounts to crystal resonator 103 during a steady state operation. Pulse generator 107 receives the inverted clock signal CLKOUT* from an inverter (not shown) having an input connected to the CLKOUT signal.

Pulse generator 107 includes multiplexer 523, invertor 526, and a reset NFET 520. Pulse generator 107 includes three serially connected inverters 517, 521, and 525 that form a delay circuit for delaying the clock signal to produce a rising signal pulse that begins at each transition of CLKOUT signal. Pulse generator 107 includes a second set of serially connected inverters 529, 531, and 533 for generating a pulse signal from the rising signal pulse that is converted by the level shifter 539 to form a clock control signal (CCO). Generator 107 includes a current source 505, for producing a bias current (IBIAS) and a current mirror including PFETs 503, 507, and 511 that are used to set the currents through invertors 517, 521, 525, 529, 531, and 533. Pulse generator 107 also includes NFETs 509 and 513 for maintaining constant voltages at nodes 510 and 512. In one embodiment, the amount of current IBIAS is trimmable to control the amount of delay provided by inverters 517, 521, and 525. In one embodiment, inverters 517, 521, and 525, and FETs 507 and 509 are sized with respect to inverters 529, 531, and 533 and FETs 511 and 513, respectfully, such that the response time of inverters 517, 521, and 525 is much slower than the response time of inverters 529, 531, and 533.

Generator 107 includes a level shifter 539 with a first input coupled to the input (node OP) of inverter 533 and a second input coupled to the output (node ON) of invertor 533. Level shifter 539 also receives the RST signal from the output of inverter 526 to reset its output to ground when asserted. When not reset, level shifter 539 provides at its output, the value of node ON where the high voltage state is VDD. Level shifter 539 provides the CCO signal at its output that is inverted by inverter 544 and is provided to the clock input of D flip Flop 541. The output of D-Flip flop 541 (the SEL signal) is provided to the control input of multiplexer 523, to inverter 547 and to NOR gate 549. Inverter 547 delays the SEL signal such that the output of NOR gate 549 provides a SPMP signal that has pulses with a pulse width of the length of the delay. The pulses occur approximately during a midpoint of a phase of the CLKOUT signal. The SPMP signal is ANDed with the CLKOUT signal to produce the PHI1 signal and ANDed with the CLKOUT* signal to produce the PHI2 signal. The PHI1 signal and the PHI2 signal occur at alternating phases of the CLKOUT signal. Generator 107 includes inverter 555 that inverts the SPMP signal to produce the capacitor charging signal SCHRG. When operating in the second configuration, the SPMP, SCHRG, PHI1, and PHI2 signals are grounded (e.g. with an enable signal (not shown) that would disable current sources and force logic gates in de-asserted states).

In other embodiments, other types of pulse generators may be used. For example, a frequency doubler may be used to produce pulses between the rising an and falling edges of the CLKOUT signal.

Figure 7:
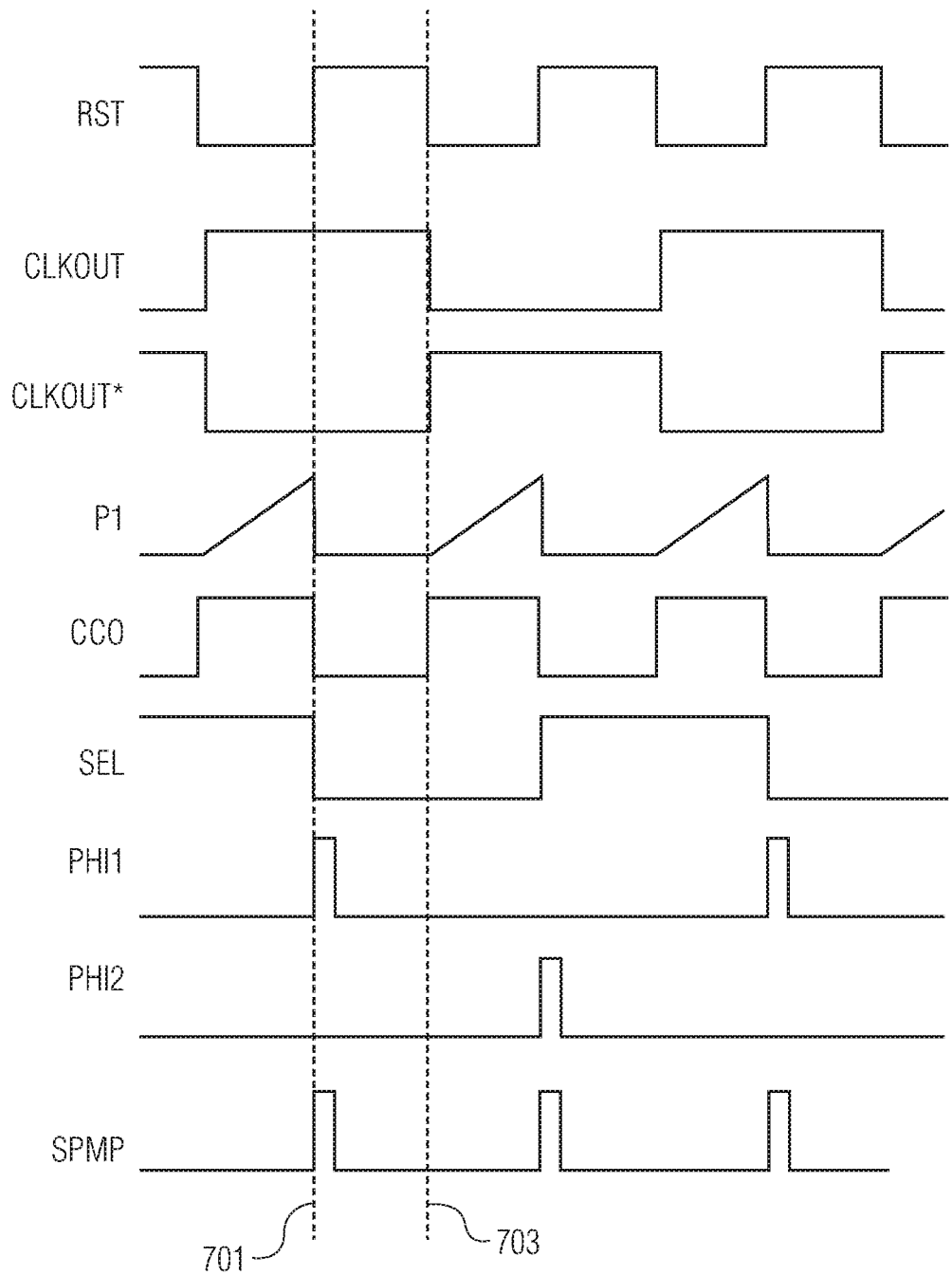
FIG. 7 is timing diagram of the clock generation circuit according to one embodiment of the present invention.

FIG. 7 is a timing diagram showing an operation of pulse generator 107 according to one embodiment. When multiplexer 523 supplies the CLKOUT* signal to inverter 526 and the CLOCKOUT* is at a low voltage at time 701, the RST signal is high which causes reset NFET 520 to become conductive to pull nodes P0 and P3 to ground. P3 being at ground causes node ON to be at a high voltage. Because the RST signal is also resetting level shifter 539, CCO is at a low voltage. The SEL signal is at a low voltage.

When the CLKOUT* transitions to a high voltage level at time 703, the RST signal goes low to release level shifter 539 from a reset condition and the CCO signal goes high in response to node ON being at a high voltage and node OP being at a low voltage. The RST signal going high makes NFET 520 non-conductive to where nodes P0 and P3 are not pulled to ground. Because node P0 was initially pulled to ground, node P1 was at a high voltage and node P2 was at a low voltage. Once node P3 is released from ground, node P3 begins to rise. Once it passes the threshold voltage of the NFET of inverter 529, P4 goes low which causes node OP to go high and node ON to go low. Node OP going high and node ON going low causes the CCO signal to go low which provides a rising edge to the clock input of flip-flop 541, which causes the SEL to change states to a high value. SEL changing to a high value causes multiplexer 523 to provide the CLKOUT signal to the inverter 526. Because the CLKOUT signal is low at that point, the RST goes high to pull nodes P0 and P3 to ground and to reset level shifter 539 to pull CCO to ground.

The delay caused by inverter 547 going from a low voltage to a high voltage behind the SEL signal going from a high voltage to a low voltage causes NOR gate 549 to generate a pulse of the SPMP signal. When the CLKOUT signal is high, the pulse is passed on in the PHI1 signal by AND gate 551. When the CLKOUT* signal is high, the pulse is passed on in the PHI2 signal by AND gate 553. Inverter 555 produces the SCHRG signal which is an inverted signal of the SPMP signal.

As shown by the timing diagram of FIG. 7, pulse generator 107 provides a series of pulses of the discharge SPMP signal that occur approximately at a midpoint during a phase of the CLKOUT signal. The pulses are separated into the PHI1 and PHI2 signals on alternating phases. In some embodiments, the occurrence of the pluses can be adjusted by adjusting the IBIAS current. In other embodiments, other types of pulse generators may be used.

Figure 6:
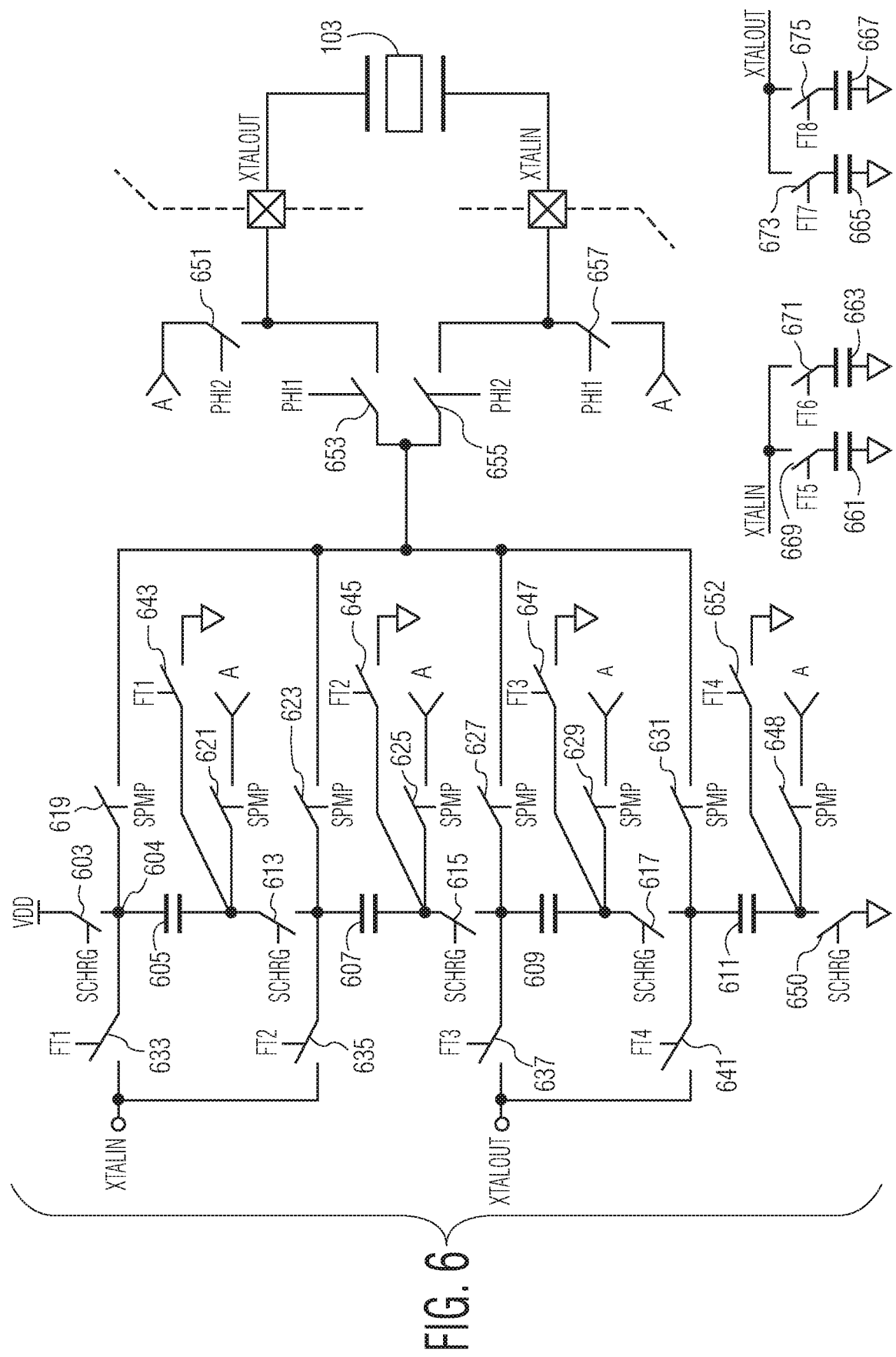
FIG. 6 is a circuit diagram of a switched capacitor circuit according to one embodiment of the present invention.

FIG. 6 is a circuit diagram of capacitor bank 105 according to one embodiment. In the embodiment shown, capacitor bank 105 includes 8 capacitors (605, 607, 609, 611, 661, 663, 665, and 667). However, other capacitor banks may include a different number of capacitors in other embodiments. In the embodiment shown, only 4 of the capacitors (661, 663, 665, and 667) are used solely for frequency tuning and the other 4 capacitors (605, 607, 609, 611) can be used for transferring energizing charge to crystal resonator 103 in the first configuration or for frequency tuning in the second configuration.

Register circuit 121 (see FIG. 1) provides tuning signals (FT1-FT8) that are each used to selectively implement one of capacitors (605, 607, 609, 611, 661, 663, 665, and 667) for frequency tuning. Signals FT5 and FT6 control switches 699 and 671 to couple capacitors 661 and 663 to the XTALIN terminal, respectively. Signals FT7 and FT8 control switches 673 and 675 to couple capacitors 665 and 667 to the XTALOUT terminal, respectively.

When operating in the second configuration, signal FT1 controls switches 633 and 643 to couple capacitor 605 to the XTALIN terminal and signal FT2 controls switches 635 and 645 to couple capacitor 607 to the XTALIN terminal to enable those capacitors to be used in frequency tuning of the timing signal on the XTALIN terminal. Signal FT3 controls switches 637 and 647 to couple capacitor 609 to the XTALOUT terminal and signal FT4 controls switches 641 and 652 to couple capacitor 611 to the XTALOUT terminal to enable those capacitors to be used in frequency tuning of the timing signal on the XTAL terminal. During the second configuration, signals SCHRG, SPMP, PHI1, and PHI2 all remain grounded such that the switches they control in FIG. 6 remain open.

When operating in the second configuration, the tuning signals FT1-8 are selectively enabled to selectively couple the tuning capacitors 605, 607, 609, 611, 661, 663, 665, and 667 for frequency tuning. When operating in the first configuration, only capacitor 661, 663, 665, and 667 are utilized in frequency tuning. When operating in the first configuration, signals FT1-FT4 are grounded.

In the second configuration, the clock signal (CLKOUT) is allowed to be tuned over a wider range. In one embodiment, where capacitors 605, 607, 609, 611, 661, 663, 665, and 667 are about 1 pF (each) and the resonance frequency of resonator 103 is either about 32 kHz or about 32.768 kHz, operating in the second configuration allows for frequency tuning of up to +/−1 to +/−2 percent and operating in the first configuration allows for frequency tuning of +/−0.5 to +/−1 percent. However, the capacitors maybe of other sizes and/or the resonator may be of other frequencies in other embodiments. Also, in other embodiments, the capacitors may be of different sizes.

In the embodiment shown, in the first configuration where capacitors 605, 607, 609, and 611 are used for providing sustaining charge to crystal resonator 103, the SCHRG, SPMP, PHI1, and PHI2 signals are asserted at selective times for capacitors 605, 607, 609, and 611 to provide charge to either the XTALOUT terminal or the XTALTIN terminal at approximately a mid-phase point of the clock cycle as determined by the pulses of the SPMP signal. During a charge transferring period as determined when the SPMP signal is asserted, switches 619, 623, 627, and 631 are closed to electrically couple the high voltage electrode of capacitors 605, 607, 609, and 611, respectively, to node B and switches 621, 625, 629, and 648 are closed to electrically couple the low voltage electrode of capacitors 605, 607, 609, and 611 to node A, respectively. During a charge transferring period, The SCHRG signal is non asserted (low in the embodiment shown) such that switches 603, 613, 615, 617, and 650 are open.

The PHI1 signal controls switches 653 and 657 and the PHI2 signal controls switches 651 and 655. The PHI1 and PhI2 signals are asserted at alternating occurrences of the SPMP signal to couple node B to one of terminal XTALOUT or XTALIN and to couple node A to the other of terminal XTALOUT or XTALIN to provide sustaining charge to resonator 103. As shown in the embodiment of FIG. 6, capacitors 605, 607, 609, and 611 are coupled in a parallel configuration to charge crystal resonator 103 during a charge transferring period.

During a capacitor charging period, the SCHRG charging signal is asserted such that switches 603, 613, 615, 617, and 650 are closed so that the capacitors are charge in a serial configuration from a VDD terminal. During this time the SPMP, PHI1, and PHI2 signals are non-asserted such that the switches they control are open.

In one embodiment, charging capacitors 605, 607, 609, and 611 in series may allow for each capacitors to be charged to a lower voltage where the crystal resonator 103 can be charged with the capacitors in parallel to allow for a reduced amount of voltage to be applied across terminals XTALOUT and XTALIN during the providing a sustaining charge to resonator 103. However, in other embodiments, capacitors 605, 607, 609, and 611 may be charged in a different series/parallel configuration and/or resonator 103 may also be charged with capacitors 605, 607, 609, and 611 in another series/parallel configuration to apply an optimal voltage to the resonator with respect to the supply voltage.

Capacitor bank 105 may be configured differently in other embodiments. For example, node A in FIG. 6 may be grounded. Also, in other embodiments, capacitors 605, 607, 609, and 611 may only be usable for providing a sustaining emerging charge to resonator 103 and not for frequency tuning.

Figure 8:
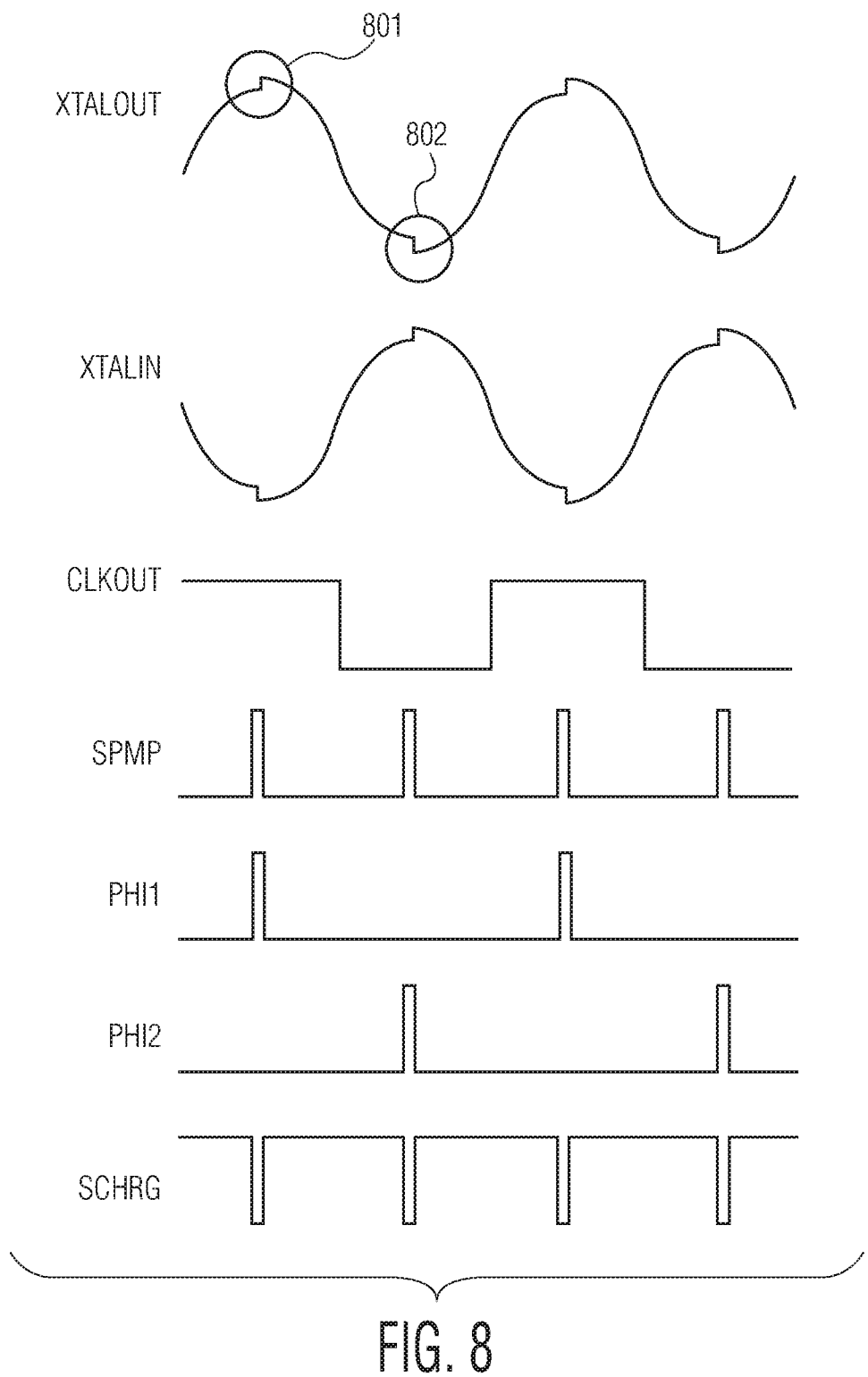
FIG. 8 is timing diagram of the clock generation circuit according to one embodiment of the present invention.

FIG. 8 is a timing diagram showing the operation of capacitor bank 105 during a steady state mode of operation in the first configuration. As shown in FIG. 8, when the SPMP pulse is asserted and the PHI1 signal is asserted, the charge from the higher voltage electrode of capacitors 605, 607, 609, and 611 (coupled in a parallel configuration) is provided to terminal XTALOUT via closed switches 619, 623, 627, and 631, node B, and closed switch 653 (see FIG. 6). During such time, the lower voltage electrode of capacitors 605, 607, 609, and 611 is coupled to terminal XTALIN via closed switches 621, 625, 629, and 648, node A, and closed switch 657. The charge being provided to the XTALOUT terminal at this time causes the voltage separation of the signal on XTALOUT versus the signal on terminal XTALIN to increase in amplitude (as shown in segment 801). When the SPMP pulse is asserted and the PHI2 signal is asserted, the charge from the higher voltage electrode of capacitors 605, 607, 609, and 611 (coupled in a parallel configuration) is provided to terminal XTALIN via closed switches 619, 623, 627, and 631, node B, and closed switch 655 (see FIG. 6). During such time, the lower voltage electrode of capacitors 605, 607, 609, and 611 is coupled to terminal XTALOUT via closed switches 621, 625, 629, and 648, node A, and closed switch 651. The charge being provided to the XTALIN terminal at this time causes the voltage separation of the signal on XTALIN versus the signal on terminal XTALOUT to increase in amplitude (as shown in segment 802).

In the embodiment shown, the sustaining charge is applied at approximately the mid-point of the high voltage phase of the XTALOUT signal and the high voltage phase of the XTALIN signal. In some embodiments, by providing a sustaining charge at this time, the charge can provided the maximum benefit while minimizing the discontinuity noise of the discrete amount of charge being provided to resonator 103.

Capacitors 605, 607, 609, and 611 are charged when the SCHRG signal is asserted via closed switches 603, 613, 615, 617, and 650. The higher voltage electrode of a capacitor is the electrode that is located closer in the series to the VDD terminal during charging. For example, node 604 is the higher voltage electrode of capacitor 605 located closest to terminal VDD when charging.

In some of the embodiments described herein, providing a discrete amount of charge to sustain the energization of a resonator in a clock generation system may provide for a clock generation system that is energy efficient and whose efficiency can be maintain for systems with different operating voltages. For example, with some systems where a sustaining charge is provided from a VDD terminal, the amount of charge being provided to a resonator is heavily dependent upon the supply terminal voltage (e.g. VDD). Which such systems, the amplitude and energy usage of the system would vary with the supply voltage. However, with some embodiments shown herein, using the capacitors to provide sustaining charge to the resonator limits the amount of charge being provided, thereby regulating the amount of energy used in energizing a resonator. In some embodiments, using capacitors to apply a sustaining charge may allow the sustaining charge to be applied at a voltage that is lower than the supply voltage, thereby resulting in a higher overall efficiency and a lower power consumption of the system.

In addition, providing a capacitor bank with capacitors that can be used for either frequency tuning or for providing sustaining charge may provide electronic system manufacturers with the flexibility of providing a more efficient system or more precise clock frequencies.

In some embodiments, the amplitude of the signals on the XTALOUT terminal and/or XTALIN terminal can be monitored to determine if the amplitude is within a specific range. If the amplitude is higher than a specific range, some of the capacitors 605, 607, 609, and 611, may be individually removed from providing charge to resonator 103. For example, referring to FIG. 6, in some embodiments, switches 619, 623, 625, and 631 and switches 621, 625, 629, and 648 can be individually controlled to selectively enable the capacitors. In some embodiments, the number of capacitors N used to provide energy to the crystal can be changed according to the supply voltage, so the optimal voltage VDD/N can be used to deliver energy to the resonator.

In the embodiment of FIG. 8, a sustaining charge is provided to the resonator 103 during every phase of the CLOCKOUT signal. However, in other embodiments, the sustaining charge is not provided at every consecutive clock phase.

In one embodiment, a circuit includes a first terminal configured to communicate a first signal with a resonator, a second terminal configured to communicate a second signal with the resonator, and a clock output configured to provide a clock signal based on at least one of the first signal or the second signal. The circuit includes a capacitor bank having a plurality of capacitors. The plurality of capacitors is configurable to be coupled in series between a first voltage supply node and a second voltage supply node for a first period of time to charge each of the capacitors of the plurality of capacitors. The plurality of capacitors is configurable to be coupled in parallel for a second period of time, mutually exclusive with the first period of time, to provide a discrete amount of charge to at least one of the first terminal or the second terminal at a delay time after an edge of the clock signal.

For another embodiment in a circuit having a first terminal configurable to be coupled to a resonator and a second terminal configurable to be coupled to the resonator, a method includes providing a clock signal based at least on a signal at the first terminal or the second terminal, charging a plurality of capacitors of a capacitor bank, and providing a discrete amount of charge from the plurality of capacitors of the capacitor bank to at least one of the first terminal or the second terminal at a delay time after an edge of the clock signal.

In another embodiment, a circuit includes a first terminal configured to communicate a first signal with a resonator, a second terminal configured to communicate a second signal with the resonator, a clock output configured to provide a clock signal based on at least one of the first signal or the second signal, and a capacitor bank having a plurality of capacitors. The plurality of capacitors is configurable to provide a discrete amount of charge to at least one of the first terminal or the second terminal at a delay time after an edge of the clock signal.

While particular, embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A circuit comprising:
   a first terminal configured to communicate a first signal with a resonator;
   a second terminal configured to communicate a second signal with the resonator;
   a clock output configured to provide a clock signal based on at least one of the first signal or the second signal; and
   a capacitor bank having a plurality of capacitors, wherein:
      the plurality of capacitors is configurable to be coupled in series between a first voltage supply node and a second voltage supply node for a first period of time to charge each of the capacitors of the plurality of capacitors, and
      the plurality of capacitors is configurable to be coupled in parallel for a second period of time, mutually exclusive with the first period of time, to provide a discrete amount of charge to at least one of the first terminal or the second terminal at a delay time after an edge of the clock signal.

2. The circuit of claim 1, further comprising:
   a comparator coupled to the clock output, wherein the comparator is configured to generate the clock signal based on a comparison using at least one of the first signal or the second signal.

3. The circuit of claim 2, wherein the comparator has a first input coupled to receive the first signal and a second input coupled to receive the second signal, wherein the comparator is configured to generate the clock signal based on a comparison using the first signal and the second signal.

4. The circuit of claim 1, wherein the resonator comprises a crystal.

5. The circuit of claim 1, wherein each clock cycle of the clock signal includes two clock phases, the circuit further comprising:
   a pulse generator coupled to receive the clock signal and configured to provide a discharge pulse during each phase of the clock signal, wherein, in each phase, the discharge pulse is provided at the delay time after each edge of the clock signal.

6. The circuit of claim 5, wherein the plurality of capacitors are configurable to be coupled in parallel in response to each discharge pulse.

7. The circuit of claim 6, wherein the pulse generator is configured to provide a charge pulse prior to each discharge pulse and the plurality of capacitors are configurable to be coupled in series in response to each charge pulse.

8. The circuit of claim 7, wherein the charge pulses correspond to an inverse of the discharge pulses.

9. The circuit of claim 1 wherein the plurality of capacitors is configurable to be coupled in parallel for a second period of time, to provide a discrete amount of charge to at least one of the first terminal or the second terminal at a delay time after an edge of the clock signal for consecutive edges of the clock signal.

10. The circuit of claim 1, wherein the plurality of capacitors is configurable to be coupled in parallel for the second time period between the first terminal and the second terminal.

11. The circuit of claim 1, wherein at least a portion of the capacitor bank is configurable to tune a frequency of the clock signal.

12. The circuit of claim 1 wherein the first terminal is characterized as a first bond pad of an integrated circuit and the second terminal is characterized as a second bond pad of the integrated circuit.

13. In a circuit having a first terminal configurable to be coupled to a resonator and a second terminal configurable to be coupled to the resonator, a method comprising:
   providing a clock signal based at least on a signal at the first terminal or the second terminal;
   wherein during the providing the clock signal:
      periodically charging a plurality of capacitors of a capacitor bank; and
      periodically providing a discrete amount of charge from the plurality of capacitors of the capacitor bank to at least one of the first terminal or the second terminal at a delay time after an edge of the clock signal through at least one a path that is periodically enabled for a time period that is less than a clock cycle of the clock signal.

14. The method of claim 13, wherein the periodically providing the discrete amount of charge from the plurality of capacitors of the capacitor bank comprises periodically coupling the plurality of capacitors of the capacitor bank in parallel, and the periodically charging the plurality of capacitors of a capacitor bank comprises periodically coupling the plurality of capacitors of the capacitor bank in series.

15. The method of claim 13, wherein each cycle of the clock signal includes two phases, and the periodically providing the discrete amount of charge includes providing the discrete amount of charge from the plurality of capacitors of the capacitor bank occurs in consecutive phases of the clock signal.

16. The method of claim 13 further comprising during a startup phase prior to the periodically providing a discrete amount of charge from the plurality of capacitors of the capacitor bank, providing charge from an oscillator circuit to at least one of the first terminal or the second terminal.

17. A circuit comprising:
   a first terminal configured to communicate a first signal with a resonator;
   a second terminal configured to communicate a second signal with the resonator;
   a clock output configured to provide a clock signal based on at least one of the first signal or the second signal;
   at least one switch; and
   a capacitor bank having a plurality of capacitors, wherein the plurality of capacitors is configurable to periodically provide a discrete amount of charge to at least one of the first terminal or the second terminal at a delay time after an edge of the clock signal through the at least one switch which is periodically closed for a time period that is less than a clock cycle of the clock signal when the clock signal is provided during a steady state operation.

18. The circuit of claim 17, wherein at least a portion of the capacitor bank is configurable to tune a frequency of the resonator.

19. The circuit of claim 17, wherein the plurality of capacitors is configurable to be coupled in parallel to provide the discrete amount of charge.

20. The circuit of claim 19, wherein the plurality of capacitors is configurable to be coupled in parallel between the first terminal and the second terminal to provide the discrete amount of charge.

21. The circuit of claim 19, wherein the plurality of capacitors is configurable to be periodically charged in series from a power supply.

22. The circuitry of claim 1 wherein the first period of time and the second period of time occur periodically when the clock signal is being provided during a steady state operation.

23. The method of claim 13 wherein the periodically charging the plurality of capacitors and the periodically providing the discrete amount of charge occurs at mutually exclusive times.

\* \* \* \* \*